United States Patent
Saita et al.

(10) Patent No.: US 10,085,343 B2
(45) Date of Patent: Sep. 25, 2018

(54) THIN-FILM CAPACITOR AND ELECTRONIC COMPONENT EMBEDDED SUBSTRATE

(71) Applicant: TDK CORPORATION, Tokyo (JP)

(72) Inventors: Hitoshi Saita, Tokyo (JP); Yoshihiko Yano, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/804,324

(22) Filed: Nov. 6, 2017

(65) Prior Publication Data

US 2018/0132355 A1 May 10, 2018

(30) Foreign Application Priority Data

Nov. 4, 2016 (JP) .................................. 2016-216476

(51) Int. Cl.
*H05K 1/16* (2006.01)
*H05K 1/18* (2006.01)
(Continued)

(52) U.S. Cl.
CPC ............. *H05K 1/182* (2013.01); *H01G 4/008* (2013.01); *H01G 4/306* (2013.01); *H01L 21/486* (2013.01);
(Continued)

(58) Field of Classification Search
CPC ......... H05K 1/182; H05K 2201/10015; H01G 4/008; H01G 4/306; H01L 21/4857;
(Continued)

(56) References Cited

U.S. PATENT DOCUMENTS 3,320,500 A * 5/1967 Axelrod .................. C22C 27/02
252/513
5,172,304 A 12/1992 Ozawa et al.
(Continued)

FOREIGN PATENT DOCUMENTS

JP H5-007063 A 1/1993
JP H5287305 A 11/1993
(Continued)

OTHER PUBLICATIONS

JP11-243032 English translation.*

*Primary Examiner* — Steven T Sawyer
(74) *Attorney, Agent, or Firm* — Oliff PLLC

(57) ABSTRACT

A thin-film capacitor includes a pair of electrode layers composed of a first electrode layer configured to store positive charges and a second electrode layer configured to store negative charges; and a dielectric layer sandwiched between the pair of electrode layers along a lamination direction. The first electrode layer includes a first main electrode layer in contact with the dielectric layer. The second electrode layer includes a second main electrode layer and a second sub-electrode layer, both of which are formed of different metallic materials. The second sub-electrode layer is sandwiched between the dielectric layer and the second main electrode layer along the lamination direction. The second main electrode layer is formed of a material having a melting point lower than both a melting point of a material of the first electrode layer, or the first main electrode layer, and that of a material of the second sub-electrode layer.

9 Claims, 4 Drawing Sheets

(51) Int. Cl.
*H01L 23/498* (2006.01)
*H01L 23/64* (2006.01)
*H01L 23/00* (2006.01)
*H01L 21/48* (2006.01)
*H01G 4/30* (2006.01)
*H01G 4/008* (2006.01)
*H05K 1/11* (2006.01)

(52) U.S. Cl.
CPC .... *H01L 21/4857* (2013.01); *H01L 23/49822* (2013.01); *H01L 23/49827* (2013.01); *H01L 23/49838* (2013.01); *H01L 23/642* (2013.01); *H01L 24/16* (2013.01); *H05K 1/115* (2013.01); *H01L 2224/16227* (2013.01); *H01L 2224/16265* (2013.01); *H01L 2924/1205* (2013.01); *H05K 2201/10015* (2013.01)

(58) Field of Classification Search
CPC ............ H01L 21/486; H01L 23/49822; H01L 23/49827; H01L 23/49838; H01L 23/642; H01L 24/16; H01L 2924/1205
See application file for complete search history.

(56) References Cited

U.S. PATENT DOCUMENTS

| | | | |
|---|---|---|---|
| 5,262,920 A * | 11/1993 | Sakuma | H01G 4/008 257/E21.009 |
| 5,851,841 A | 12/1998 | Ushikubo et al. | |
| 6,775,150 B1 | 8/2004 | Chakravorty et al. | |
| 7,038,310 B1 | 5/2006 | Nakatani et al. | |
| 2003/0068517 A1 | 4/2003 | Andresakis et al. | |
| 2006/0000542 A1 | 1/2006 | Min et al. | |
| 2006/0131069 A1 * | 6/2006 | Shimizu | H01L 21/4857 174/260 |
| 2006/0137905 A1 | 6/2006 | Kariya et al. | |
| 2006/0245139 A1 | 11/2006 | Kariya | |
| 2007/0025059 A1 | 2/2007 | Uchida et al. | |
| 2007/0105278 A1 | 5/2007 | Kariya et al. | |
| 2007/0132088 A1 | 6/2007 | Kariya et al. | |
| 2007/0134910 A1 | 6/2007 | Kariya et al. | |
| 2007/0236866 A1 | 10/2007 | Katoh et al. | |
| 2007/0297157 A1 | 12/2007 | Tanaka | |
| 2008/0104833 A1 | 5/2008 | Kariya et al. | |
| 2008/0142976 A1 | 6/2008 | Kawano | |
| 2009/0038835 A1 | 2/2009 | Tanaka et al. | |
| 2009/0064493 A1 | 3/2009 | Kariya et al. | |
| 2009/0129039 A1 | 5/2009 | Kariya et al. | |
| 2009/0175011 A1 | 7/2009 | Kariya | |
| 2009/0200069 A1 | 8/2009 | Kariya et al. | |
| 2009/0200639 A1 | 8/2009 | Kariya | |
| 2010/0181285 A1 | 7/2010 | Tanaka | |
| 2010/0193227 A1 | 8/2010 | Kariya et al. | |
| 2010/0270261 A1 * | 10/2010 | Figueroa | H01G 4/008 216/6 |
| 2011/0063811 A1 | 3/2011 | Kariya et al. | |
| 2011/0271524 A1 | 11/2011 | Tanaka et al. | |
| 2013/0342960 A1 | 12/2013 | Saita et al. | |
| 2015/0075843 A1 | 3/2015 | Yamaguchi et al. | |

FOREIGN PATENT DOCUMENTS

| | | |
|---|---|---|
| JP | H9153597 A | 6/1997 |
| JP | H9208394 A | 8/1997 |
| JP | 2001156455 A | 6/2001 |
| JP | 2001185443 A | 7/2001 |
| JP | 2003022926 A | 1/2003 |
| JP | 2004134451 A | 4/2004 |
| JP | 2006173544 A | 6/2006 |
| JP | 2007150207 A | 6/2007 |
| JP | 2008124414 A | 5/2008 |
| JP | 2010027948 A | 2/2010 |
| JP | 2014007239 A | 1/2017 |
| WO | 2005080074 A1 | 9/2005 |
| WO | 2008129704 A1 | 10/2008 |

* cited by examiner

THIN-FILM CAPACITOR AND ELECTRONIC COMPONENT EMBEDDED SUBSTRATE

TECHNICAL FIELD

The present invention relates to a thin-film capacitor and an electronic component embedded substrate.

BACKGROUND

Various studies have been made on the structure of an electrode layer for purpose of improving performance of a thin-film capacitor. For example, Japanese Unexamined Patent Publication No. 2014-7239 proposes an electrode layer having a double-layered structure. WO 2008/129704 proposes to take into account the ionization tendency of metals forming an electrode.

SUMMARY

However, a thin-film capacitor including an electrode layer, which has been studied in the related art, seeks further improvement in reliability with respect to high temperature load. Herein, the "reliability with respect to high temperature load" represents reliability of a thin-film capacitor which is inferred from a degree of deterioration of insulation resistance caused by exposing a thin-film capacitor element under a temperature environment higher than room temperature and by simultaneously applying a voltage to the capacitor element under the environment for a long time.

The present invention has been made in light of the above situation, and an object of the present invention is to provide a thin-film capacitor and an electronic component embedded substrate capable of improving reliability including reliability with respect to high temperature load.

In order to achieve the above object, a thin-film capacitor according to an embodiment of the present invention includes: a pair of electrode layers composed of a first electrode layer configured to store a positive charge and a second electrode layer configured to store a negative charge; and a dielectric layer sandwiched between the pair of electrode layers along a lamination direction, wherein the first electrode layer includes a first main electrode layer which is in contact with the dielectric layer, and the second electrode layer includes a second main electrode layer and a second sub-electrode layer, both of which are formed of different metallic materials, wherein the second sub-electrode layer is sandwiched between the dielectric layer and the second main electrode layer along the lamination direction, and the second main electrode layer is formed of a material having a melting point lower than both a melting point of a material of the first main electrode layer and a melting point of a material of the second sub-electrode layer.

According to the aforementioned thin-film capacitor, the thin-film capacitor employs two electrode layers including the main electrode layers formed of materials having different melting points, and negative charges are stored in the second electrode layer in which the material having the lower melting point serves as the main electrode layer. Furthermore, in the thin-film capacitor, the second sub-electrode layer formed of the material having the melting point higher than that of the material included in the second main electrode layer is provided between the dielectric layer and the second main electrode layer which is the main electrode layer in the second electrode layer that stores negative charges. Thus, according to the thin-film capacitor, it is possible to improve reliability including reliability with respect to high temperature load.

Herein, the following aspect may be employed, that is, the first electrode layer includes a first sub-electrode layer formed of a metallic material different from the material of the first main electrode layer, wherein the first sub-electrode layer is disposed on a side opposite to the dielectric layer along the lamination direction, being in contact with the first main electrode layer, and the melting point of the material of the first main electrode layer is higher than a melting point of a material of the first sub-electrode layer.

In such a manner, when the first electrode layer also includes a plurality of layers: the first main electrode layer and the first sub-electrode layer, the material of the first sub-electrode layer is selected so as to achieve the aforementioned structure. Accordingly, it is possible to improve reliability including reliability with respect to high temperature load.

Furthermore, the following aspect may be employed, that is, the thin-film capacitor has layers at both ends, when viewed along the lamination direction, both of which are formed of a material including copper as a main component.

In such a manner, when the thin-film capacitor is configured to have layers at both ends formed of the material including copper as a main component, it is possible to enhance adhesion with vias and the like electrically connected to the pair of electrode layers of the thin-film capacitor, which leads to improvement in the reliability.

Still further, the following aspect may be employed, that is, at least one layer of each layer at both ends in the thin-film capacitor, when viewed along the lamination direction, has an alloy layer between a layer laminated on the inner side of each layer at both ends, wherein the alloy layer includes copper and a main component of the layer laminated on the inner side.

In such a manner, when the alloy layer is provided between the layers at both ends of the thin-film capacitor and the layer laminated on the inner side thereof, it is possible to enhance adhesion between the layers at both ends and the layer laminated on the inner side, which leads to improvement in the reliability.

Still further, the following aspect may be employed, that is, the first main electrode layer and the second sub-electrode layer are formed of a material including as a main component any one of tantalum, nickel, tungsten, platinum, palladium, iridium, ruthenium, and rhodium, or an alloy of these metals.

These metals are characterized by a low tendency of diffusion with respect to a dielectric layer and the like even when high temperature load is applied to these metals. Therefore, selecting the above metallic materials as the main component of the first main electrode layer and that of the second sub-electrode layer leads to further improvement in reliability with respect to high temperature load.

The following aspect may be employed, that is, the second sub-electrode layer has a thickness of 0.05 μm to 10 μm. With such a configuration, it is possible to prevent the component of the material of the second main electrode layer from diffusing into the dielectric layer and the like through the second sub-electrode layer.

Furthermore, an electronic component embedded substrate according to an embodiment of the present invention includes the aforementioned thin-film capacitor; and a pair of vias electrically connected to the first electrode layer and the second electrode layer of the thin-film capacitor.

According to the aforementioned electronic component embedded substrate, the electronic component embedded substrate includes the thin-film capacitor capable of improving reliability including reliability with respect to high temperature load as described above so that it is possible to obtain an electronic component embedded substrate capable of improving reliability including reliability with respect to high temperature load.

According to the present invention, there are provided a thin-film capacitor and an electronic component embedded substrate capable of improving reliability including reliability with respect to high temperature load.

DETAILED DESCRIPTION

Figure 1:
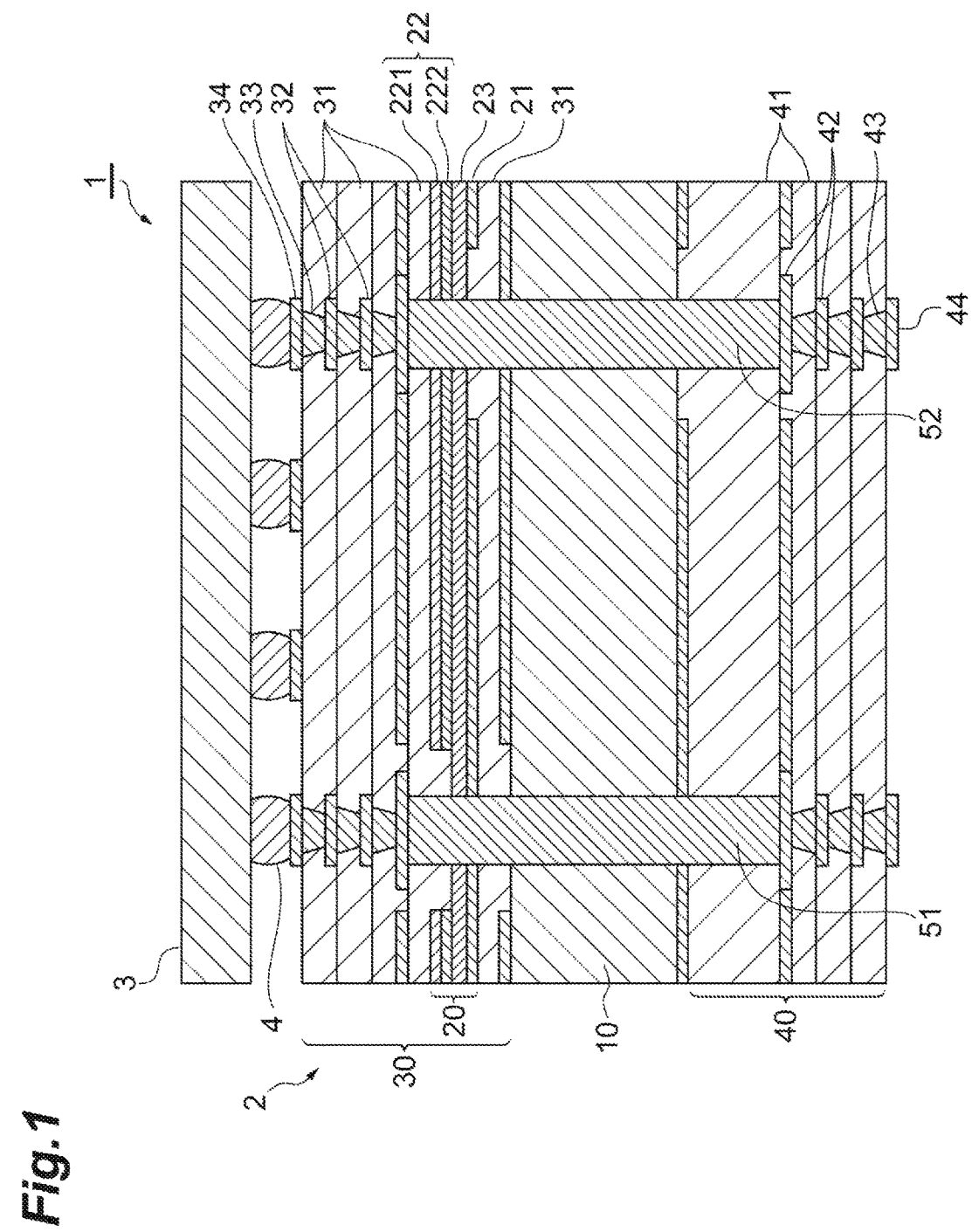
FIG. 1 is a schematic view of a substrate mounting structure including a thin-film capacitor and an electronic component embedded substrate according to an embodiment of the present invention.

Hereinafter, an embodiment of the present invention will be described in detail with reference to the accompanying drawings. In description of the drawings, note that the same elements will be denoted with the same reference numerals and redundant description will be omitted.

FIG. 1 is a schematic view of describing a substrate mounting structure including an electronic component embedded substrate incorporating a thin-film capacitor according to an embodiment of the present invention. The substrate mounting structure illustrated in FIG. 1 is used for electronic devices such as communication terminals, and health care devices.

As illustrated in FIG. 1, the substrate mounting structure 1 includes an electronic component embedded substrate 2 incorporating a thin-film capacitor 20 which is a thin-film electronic component; and an electronic component 3 mounted on a main surface of the electronic component embedded substrate 2. The electronic component embedded substrate 2 is a substrate provided with a thin-film capacitor and wiring layers, details of which will be described later. The electronic component 3 is mounted on the electronic component embedded substrate 2 by flip chip bonding, involving a bump 4 that includes a conductive material. Although an example of the electronic component 3 may include a semiconductor chip such as an IC chip, the electronic component 3 is not particularly limited thereto. In the substrate mounting structure 1 illustrated in FIG. 1, an active part can be used as the electronic component 3, and a passive part can be used as the thin-film electronic component inside the electronic component embedded substrate 2.

As illustrated in FIG. 1, the electronic component embedded substrate 2 includes a core substrate 10; a wiring layer 30 laminated on one main surface of the core substrate 10; a wiring layer 40 laminated on the other main surface of the core substrate 10; and through hole vias 51 and 52 configured to connect the wiring layers 30 and 40. The thin-film capacitor 20 is laminated inside the wiring layer 30 along a lamination direction.

As the core substrate 10, an insulating material can be used appropriately. A material preferably used as the core substrate 10 is not particularly limited as long as the material has insulation properties and is moldable into a sheet or a film. A known material, for example, a silicon substrate, and an organic substrate such as a glass epoxy resin or Bismaleimide-Triazine (BT) resin may be used as the core substrate 10. The core substrate 10 may have, for example, a resin coated copper (RCC) structure. A conducting layer including a copper foil and the like may also be used as the core substrate 10.

An adhesive layer may be provided between the core substrate 10 and the wiring layer 30. The adhesive layer is not particularly limited as long as it can fix the wiring layer 30 to the core substrate 10. For example, a pre-thermosetting resin (a prepreg, a filler containing composite material), or an adhesive (an adhesive-backed sheeting, a paste with metal powder) may be used as the adhesive layer. It should be noted that another wiring layer formed by a conducting layer and an insulating layer may be provided between the core substrate 10 and the wiring layer 30.

Although details will be described later, the thin-film capacitor 20 provided inside the wiring layer 30 includes a first electrode layer 21, a second electrode layer 22, and a dielectric layer 23 sandwiched between a pair of electrode layers: the first electrode layer 21 and the second electrode layer 22. Although FIG. 1 illustrates an example in which the first electrode layer 21 is disposed on a side close to the core substrate 10, the first electrode layer 21 and the second electrode layer 22 may change their positions. In the thin-film capacitor 20, the second electrode layer 22 is configured to include two electrode layers (a second main electrode layer 221, and a second sub-electrode layer 222) laminated along the lamination direction. This point will be described in detail later.

An insulating layer 31 of the wiring layer 30 is formed between the thin-film capacitor 20 and the core substrate 10. A material of the insulating layer 31 is not particularly limited as long as it is an insulating material. For example, resin (polyimide resin, epoxy resin, acrylic resin, phenol resin, and the like) may be used as a main component of the insulating layer 31. A filler having insulating properties or high electric resistance may be mixed into the insulating layer 31. This makes it possible to increase mechanical strength of the insulating layer 31. The insulating layer 31 is not only disposed between the thin-film capacitor 20 and the core substrate 10 but also disposed to fill a gap formed by a patterning process in the first electrode layer 21 or the second electrode layer 22 of the thin-film capacitor 20.

The wiring layers 30 and 40 and the through hole vias 51 and 52 of the electronic component embedded substrate 2 will now be described. The wiring layer 30 is disposed on the upper side of the core substrate 10 in the drawing. In the wiring layer 30, a plurality of insulating layers 31 formed of an insulating material and a plurality of conducting layers 32 formed of a conductive material are alternately laminated along the lamination direction, and a plurality of vias 33 formed of a conductive material is also disposed to electrically connect the plurality of conducting layers 32. The vias 33 are not formed in a part where the thin-film capacitor 20 is provided, and the after-mentioned through hole vias 51 and 52 are provided instead. A terminal portion 34 formed of a conductive material, as similar to the conducting layers 32, is disposed at an end of the uppermost via 33, and a bump 4 is formed on the terminal portion 34.

The wiring layer 40 is disposed on the lower side of the core substrate 10 in the drawing (on the opposite side of the thin-film capacitor 20). In the wiring layer 40, a plurality of insulating layers 41 formed of an insulating material and a plurality of conducting layers 42 formed of a conductive material are alternately laminated along the lamination direction, and a plurality of vias 43 formed of a conductive material is also disposed to electrically connect the plurality of conducting layers 42. A terminal portion 44 formed of a conductive material, as similar to the conducting layers 42, is disposed at an end of the uppermost via 43.

Both of the through hole vias 51 and 52 penetrate the core substrate 10 and the thin-film capacitor 20 and connect the vias 33 of the wiring layer 30, which is disposed above the through hole vias 51 and 52, and the vias 43 of the wiring layer 40, which is disposed beneath the through hole via 51 and 52. In the example illustrated in FIG. 1, the through hole via 51 is electrically connected to the first electrode layer 21 of the thin-film capacitor 20, but is insulated from the second electrode layer 22 by the insulating layer 31. Furthermore, the through hole via 52 is electrically connected to the second electrode layer 22 of the thin-film capacitor 20, but is insulated from the first electrode layer 21 by the insulating layer 31. In other words, the through hole via 51 is electrically connected to the first electrode layer 21, and the through hole via 52 is electrically connected to the second electrode layer 22. The through hole via 51 supplies positive charges to the first electrode layer 21 by connection with a power supply. In other words, the first electrode layer 21 has a function of storing positive charges supplied through the through hole via 51. Furthermore, the through hole via 52 supplies negative charges to the second electrode layer 22 by connection with a power supply. In other words, the second electrode layer 22 has a function of storing negative charges supplied through the through hole via 52.

A material of the vias 33 and 43 and that of the through hole vias 51 and 52 are not particularly limited as long as they are a conductive material, but a material including copper (Cu) as a main component is often selected because of its processability and the like.

It should be noted that structures of the wiring layers 30 and 40, and the through hole vias 51 and 52 are appropriately changed in accordance with specifications and the like required for the electronic component embedded substrate 2. The number of laminated layers of the insulating layer 31 and the conducting layer 32 in the wiring layer 30, the number of laminated layers of the conducting layer 42 and the insulating layer 41 in the wiring layer 40, and structures of the through hole vias 51 and 52 are also changed appropriately in accordance with specifications and the like required for the electronic component embedded substrate 2. Furthermore, the arrangement of the thin-film capacitor 20 can also be changed appropriately.

The electronic component embedded substrate 2 has a thickness of about 20 μm to 1.5 mm. Although a thickness of the core substrate 10 is not particularly limited, it may be, for example, about 1 μm to 1 mm. When the core substrate 10 has the RCC structure, a thickness of a copper foil may be about 5 μm to 250 μm. Even when the core substrate 10 is a conducting layer, a thickness thereof can be set to about 5 μm to 250 μm. Although a thickness of the thin-film capacitor 20 is not particularly limited, it may be, for example, about 5 μm to 200 μm.

Hereinafter, the thin-film capacitor 20 will be described with reference to FIG. 2. As described above, the thin-film capacitor 20 includes the first electrode layer 21, the second electrode layer 22, and the dielectric layer 23.

The first electrode layer 21 may be a multi-layered electrode layer, or may be a single-layered electrode layer. In the thin-film capacitor 20, described herein is a case where the first electrode layer 21 is a single-layered electrode layer (a first main electrode layer). On the other hand, the second electrode layer 22 is formed by laminating two electrode layers: the second main electrode layer 221 and the second sub-electrode layer 222, along the lamination direction. On the lower side of the dielectric layer 23 in the drawing, the First electrode layer 21 (first main electrode layer) is in contact with the dielectric layer 23. On the upper side of the dielectric layer 23 in the drawing, the second sub-electrode layer 222 of the second electrode layer 22 is in contact with the dielectric layer 23, and the second sub-electrode layer 222 is sandwiched by the dielectric layer 23 and the second main electrode layer 221. In other words, in the thin-film capacitor 20, the first electrode layer 21, the dielectric layer 23, the second sub-electrode layer 222, and the second main electrode layer 221 are laminated in this order mentioned along the lamination direction. The second sub-electrode layer 222 may also be referred to as a "barrier metal layer" provided between the second main electrode layer 221 and the dielectric layer 23.

The first electrode layer 21 stores positive charges supplied through the through hole via 51, and the second electrode layer 22 stores negative charges supplied through the through hole via 52. FIG. 2 schematically illustrates the through hole vias 51 and 52 configured to supply and store positive charges and negative charges.

In the thin-film capacitor 20 of the present embodiment, the second electrode layer 22 includes two layers as described above, but it should be noted that an electrode layer having the largest thickness (length in the lamination direction) is referred to as a "main electrode layer (the second main electrode layer 221 in the second electrode layer 22)". In other words, in the second electrode layer 22, a thickness of the second main electrode layer 221 is larger than that of the second sub-electrode layer 222. In such a manner, in the present embodiment, when one electrode layer includes a plurality of metal layers laminated in a thickness direction, an electrode layer having the largest thickness is referred to as a main electrode layer. However, it should be noted that a main electrode layer and a sub-electrode layer may have a substantially equal thickness.

In regard to the first electrode layer 21 (the first main electrode layer), the second main electrode layer 221 of the second electrode layer 22, and the second sub-electrode layer 222 of the second electrode layer 22, although each electrode layer is preferably formed of a material including tantalum (Ta), nickel (Ni), copper (Cu), tungsten (W), platinum (Pt), palladium (Pd), iridium (Ir), ruthenium (Ru), rhodium (Rh), an alloy containing these metals, or an intermetallic compound as a main component, the material of each electrode layer is not limited thereto. In regard to the first electrode layer 21 and the second sub-electrode layer 222 which are the metal layers in contact with the dielectric layer 23, it is particularly preferable to select as a main component a metal other than copper among the above components. In other words, the first electrode layer 21 and the second sub-electrode layer 222 are preferably formed of a material including tantalum (Ta), nickel (Ni), tungsten (W), platinum (Pt), palladium (Pd), iridium (Ir), ruthenium (Ru), rhodium (Rh), an alloy containing these metals, or an intermetallic compound as a main component. These metals are characterized by a low tendency of diffusion with respect to a dielectric layer and the like even when high temperature load is applied to these metals. Therefore, selecting the above metallic materials as the main component of the first electrode layer 21 (the first main electrode layer) and that of the second sub-electrode layer 222 leads to improvement in reliability with respect to high temperature load. It should be noted that each electrode layer may include a trace of impurities and the like in addition to a material which is to be the main component.

Herein, as a characteristic of the thin-film capacitor 20 according to the present embodiment, the metallic materials included in the first electrode layer 21 (the first main electrode layer), the second main electrode layer 221 of the second electrode layer 22, and the second sub-electrode layer 222 of the second electrode layer 22 are selected so that each melting point satisfies a predetermined relationship. Specifically, each melting point satisfies the following relationships in Formulae (1) and (2), where T1 represents the melting point of the material of the first electrode layer 21, T2 represents the melting point of the material of the second main electrode layer 221 of the second electrode layer 22, and T3 represents the melting point of the material of the second sub-electrode layer 222 of the second electrode layer 22.

$$T1 > T2 \quad (1)$$

$$T3 > T2 \quad (2)$$

In other words, the melting point T2 of the material of the second main electrode layer 221 of the second electrode layer 22 is lower than the melting point T1 of the material of the first electrode layer 21 and the melting point T3 of the material of the second sub-electrode layer 222 of the second electrode layer 22. In the thin-film capacitor 20, the first electrode layer 21, the second main electrode layer 221, and the second sub-electrode layer 222 are selected so as to satisfy the above relationships.

In regard to a combination of materials of the first electrode layer 21 (the first main electrode layer), the second main electrode layer 221, and the second sub-electrode layer 222 that satisfies the above relationships, Ni may be selected as the main component of the second main electrode layer 221 and Cu may be selected as the main components of the first electrode layer 21 and the second sub-electrode layer 222. It should be noted that this combination is an example, and the materials of the aforementioned electrode layers are not limited to this combination.

The dielectric layer 23 is formed of a perovskite dielectric material. Herein, examples of the perovskite dielectric material in the present embodiment include dielectric (ferroelectric) materials having a perovskite structure such as $BaTiO_3$ (barium titanate), $(Ba_{1-x}Sr_x)TiO_3$ (barium strontium titanate), $(Ba_{1-x}Ca_x)TiO_3$, $PbTiO_3$, $Pb(Zr_xTi_{1-x})O_3$, and complex perovskite relaxor ferroelectric materials typified by $Pb(Mg_{1/3}Nb_{2/3})O_3$, and the like. Herein, in the dielectric (ferroelectric) materials having a perovskite structure, or the perovskite relaxor ferroelectric materials, although ratios of A-site to B-site are usually integer ratios, they may be intentionally displaced from the integer ratios in order to improve characteristics. In order to control the characteristics of the dielectric layer 23, the dielectric layer 23 may appropriately contain an additive as an accessory component.

In regard to the first electrode layer 21 and the second electrode layer 22 of the thin-film capacitor 20, a thickness of each electrode layer is preferably set to 0.1 µm to 50 µm, more preferably 1 µm to 40 µm, and still more preferably about 10 µm to 30 µm. Each electrode layer having an excessively thin thickness tends to make it difficult to handle each electrode layer when manufacturing the thin-film capacitor 20. Furthermore, each electrode layer having an excessively thick thickness tends to deteriorate adhesion between the dielectric layer 23 and each electrode layer. An area of each electrode layer is, for example, about 0.5 mm².

In a case where the second electrode layer 22 includes two metal layers as in the thin-film capacitor 20, the thickness of the second main electrode layer 221 is preferably set to about 1 µm to 40 µm so as to ensure a sufficient thickness as compared with the thickness of the second sub-electrode layer 222. The thickness of the second sub-electrode layer 222 is preferably set to 0.05 µm to 10 µm. The second sub-electrode layer 222 having a thickness smaller than 0.05 µm leads to malfunction as the barrier metal layer. On the other hand, the second sub-electrode layer 222 having a thickness larger than 10 µm may lead to deterioration in a high frequency characteristic.

Figure 2:
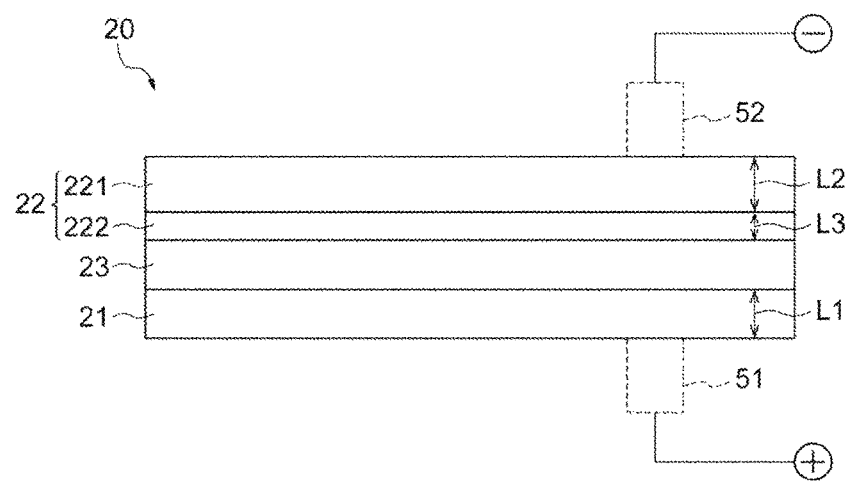
FIG. 2 is a schematic view of the thin film capacitor.

As illustrated in FIG. 2, it is preferable to satisfy the following Formulae (3) and (4), where L1 represents the thickness of the first electrode layer 21, L2 represents the thickness of the second main electrode layer 221 of the second electrode layer 22, and L3 represents the thickness of the second sub-electrode layer 222 of the second electrode layer 22.

$$L2 > L3 \quad (3)$$

$$L1 > L3 \quad (4)$$

Among the above Formulae, Formula (3) represents a relationship between the thickness of the second main electrode layer 221 and that of the second sub-electrode layer 222. Furthermore, Formula (4) represents a relationship between the thickness of the second sub-electrode layer 222 and that of the first electrode layer 21. In the thin-film capacitor 20 according to the present embodiment, there is a difference between the melting point of the material included in the first electrode layer 21 and the melting point of the material included in the second main electrode layer 221 of the second electrode layer 22 so as to improve performance of the thin-film capacitor 20. This point will be described in detail later. Therefore, it is preferable to satisfy the relationship in Formula (4) which is a structure capable of effectively achieving the effect of the thin-film capacitor 20.

The dielectric layer 23 of the thin-film capacitor 20 has a thickness of, for example, 10 nm to 1000 nm. An area of the dielectric layer 23 is, for example, about 0.9×0.5 mm².

The first electrode layer 21 on the lower side of the thin-film capacitor 20 is preferably formed of a metallic foil, serving both as a substrate and an electrode. As described above, the first electrode layer 21 according to the present embodiment preferably serves as a substrate as well as an electrode. However, a substrate/electrode film structure which is a combination of a substrate formed of Si or alumina and the first electrode layer 21 may also be employed. In a case where the thin-film capacitor 20 is disposed inside the electronic component embedded substrate 2 illustrated in FIG. 1, it should be noted that the first electrode layer 21 is preferably formed of a metallic foil.

Hereinafter, a manufacturing method of the thin-film capacitor 20 and the electronic component embedded substrate 2 will be described. FIGS. 3A to 3D illustrate the periphery of the wiring layer 30 to which the thin-film capacitor 20 is attached and that of the core substrate 10 in the electronic component embedded substrate 2 illustrated in FIG. 1. An example of the manufacturing method of the thin-film capacitor 20 and the electronic component embedded substrate 2 will now be described with reference to FIGS. 3A to 3D. It should be noted that the manufacturing method of the thin-film capacitor 20 and the electronic component embedded substrate 2 is not limited to the method described with reference to FIGS. 3A to 3D.

Figure 3A:
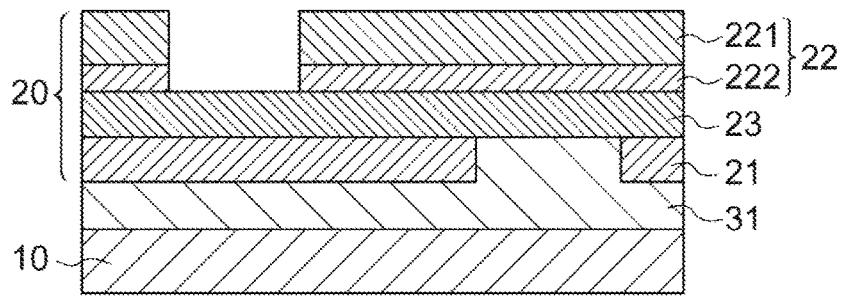
FIGS. 3A to 3D are views describing a manufacturing method of the electronic component embedded substrate.

FIG. 3A illustrates a state in which the thin-film capacitor 20 is laminated on the core substrate 10 with the insulating layer 31 interposed therebetween. A dielectric material which is to be the dielectric layer 23 is laminated on a metal layer which is to be the first electrode layer 21. Furthermore, a metal layer which is to be the second sub-electrode layer 222 of the second electrode layer 22 and a metal layer which is to be the second main electrode layer 221 are laminated in order. Then, this laminated body is fired so as to manufacture the thin-film capacitor 20. The timing of firing is not particularly limited as long as it is carried out after lamination of the dielectric material. For example, firing may be carried out before laminating each layer which is to be the second electrode layer 22. As illustrated in FIG. 3A, the first electrode layer 21 and the second electrode layer 22 of the thin-film capacitor 20 is formed with an opening by patterning and the like; however, a method of forming the opening is not particularly limited. Although a layer corresponding to the wiring layer 40 (see FIG. 1) is formed on the lower side of the core substrate 10, such a layer is omitted in FIGS. 3A to 3D.

Figure 3B:
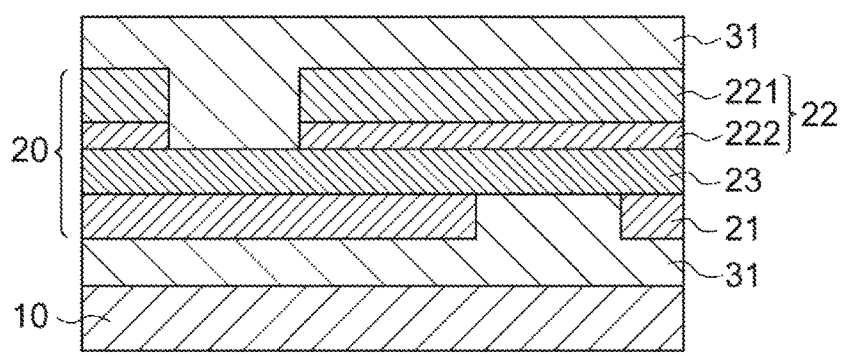
Figure 3C:
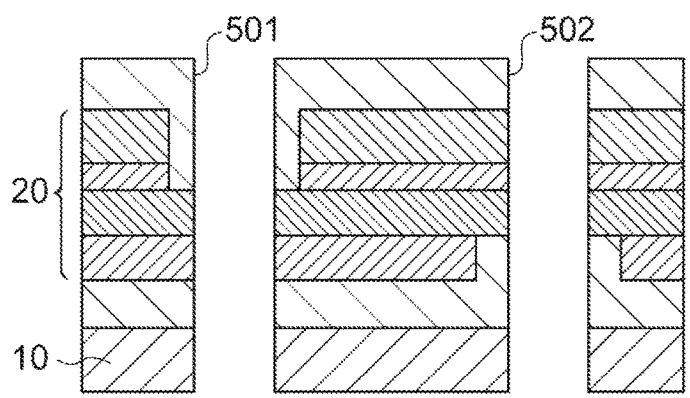
Figure 3D:
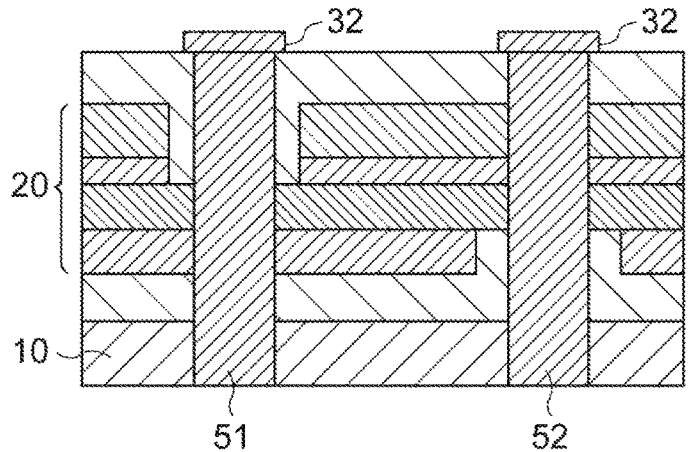

Next, as illustrated in FIG. 3B, the insulating layer 31 is formed on the thin-film capacitor 20 which is disposed on the core substrate 10. Next, as illustrated in FIG. 3C, through holes 501 and 502 penetrating the core substrate 10, the thin-film capacitor 20, and the insulating layer 31 are provided by laser processing and the like at positions where the through hole vias 51 and 52 are to be provided. Next, as illustrated in FIG. 3D, the through hole vias 51 and 52 are formed by filling the through holes 501 and 502 with conductors. Furthermore, the conducting layers 32 are provided on the through hole vias 51 and 52. Then, the insulating layers 31, the conducting layers 32, and the vias 33 included in the wiring layer 30 and the insulating layers 41, the conducting layers 42, and the vias 43 included in the wiring layer 40 are formed as appropriate so as to manufacture the electronic component embedded substrate 2.

Subsequently, the electronic component embedded substrate 2 is divided as appropriate, and then the electronic component 3 is mounted with the bump 4 involved, whereby obtaining the substrate mounting structure 1 illustrated in FIG. 1.

As described above, the thin-film capacitor 20 used in the electronic component embedded substrate 2 according to the present embodiment satisfies a relationship of T1>T2, where T1 represents the melting point of the material of the first electrode layer 21 (the first main electrode layer) that stores positive charges, and T2 represents the melting point of the material of the second main electrode layer 221 of the second electrode layer 22 that stores negative charges. It is known that a melting point of a material included in an electrode layer is substantially proportional to self-diffusion activation energy of the material. However, the inventors have found that reliability of the thin-film capacitor 20, especially reliability with respect to high temperature load, improves in a case where an electrode layer whose main component is a material having high self-diffusion activation energy, or a high melting point, serves as an electrode layer that stores positive charges, and where an electrode layer whose main component is a material having low self-diffusion activation energy, or a low melting point, serves as an electrode layer that stores negative charges. It should be noted that the "reliability with respect to high temperature load" represents reliability of a thin-film capacitor which is inferred from a degree of deterioration of insulation resistance caused by exposing a thin-film capacitor element under a temperature environment higher than room temperature and by simultaneously applying a voltage to the capacitor element under the environment for a long time.

In other words, in a case where two electrode layers including main electrode layers formed of materials having different melting points are used, and an electrode layer including a main electrode layer formed of a material having a low melting point (the second electrode layer 22 in the thin-film capacitor 20) is configured to store negative charges (is biased to the negative side), it is confirmed that such a structure improves reliability of the thin-film capacitor 20 and prolongs lifetime as a capacitor.

The reliability with respect to high temperature load of the thin-film capacitor 20 according to the present embodiment can be confirmed specifically by a procedure exemplified below. A square Ni metallic foil having a side of 100 mm is prepared as the first electrode layer 21, and the dielectric layer 23 including $BaTiO_3$ is formed on the Ni metallic foil by, for example, a sputtering method. The dielectric layer 23 at this time may have a thickness of 600 nm. Next, an Ni electrode layer with a thickness of 0.5 μm serving as the second sub-electrode layer 222 of the second electrode layer 22 and a Cu electrode layer with a thickness of 18 μm serving as the second main electrode layer 221 are formed, for example, by electrolytic plating. Next, the second electrode layer 22 is subjected to patterning, using a usual photolithography process so as to form a plurality of quadrilateral electrodes having a side of 5 mm on the dielectric layer 23. Accordingly, a plurality of quadrilateral thin-film capacitors 20 having a side of 5 mm are obtained.

The plurality of quadrilateral thin-film capacitors 20 having a side of 5 mm obtained by the aforementioned method is divided into two groups and tested under the following conditions.

Group 1: A voltage is applied so that positive charges are stored in the first electrode layer 21 and negative charges are stored in the second electrode layer 22.

Group 2: A voltage is applied so that negative charges are stored in the first electrode layer 21 and positive charges are stored in the second electrode layer 22.

Each of the thin-film capacitors 20 divided into two groups is subjected to a test to apply 1000 hr voltage under the following environment: a DC voltage of 4V, and a temperature of 125° C. For each thin-film capacitor 20, an insulation resistance value is measured before and after the test at DC 4V (measured in the same direction as a voltage orientation during the test) at room temperature. Comparing insulation resistance values before and after the test, it is possible to evaluate reliability with respect to high temperature load of each thin-film capacitor 20 based on whether each insulation resistance is degraded by 1 digit or more. At this time, preparing a plurality of samples for each group makes it possible to evaluate the reliability with respect to high temperature load of each thin-film capacitor 20 in a quantitative manner.

In an example employing the aforementioned dimension and shape, when a hundred of thin-film capacitors 20 are formed in each group so as to be evaluated, insulation resistance of all one hundred thin-film capacitors 20 in Group 1 decreases by less than one digit. In regard to the thin-film capacitors 20 in Group 2, although insulation resistance decreases by less than one digit in thirty out of one hundred thin-film capacitors 20, insulation resistance decreases by one digit or more in the remaining seventy thin-film capacitors 20. In other words, it is confirmed that the thin-film capacitors 20 of Group 1 have higher reliability with respect to high temperature load.

In a conventional thin-film capacitor, when a main electrode layer (the second main electrode layer 221 in the thin-film capacitor 20) formed of a material having a low melting point is in contact with a dielectric layer 23, the material of the main electrode layer may diffuse toward the dielectric layer 23 due to electromigration, which leaves room for improvement in reliability with respect to high temperature load. Therefore, in the thin-film capacitor 20 according to the present embodiment, the second sub-electrode layer 222 formed of the material having the melting point higher than that of the material included in the second main electrode layer 221 is provided between the second main electrode layer 221 and the dielectric layer 23 so as to improve the reliability with respect to high temperature load. In other words, the thin-film capacitor 20 according to the present embodiment employs the two electrode layers including the main electrode layers formed of the materials having different melting points, and the electrode layer including the main electrode layer formed of the material having the lower melting point (the second electrode layer 22 in the thin-film capacitor 20) is configured to store negative charges (is biased to the negative side). Furthermore, in the thin-film capacitor 20, the second sub-electrode layer 222 formed of the material having the melting point higher than that of the material included in the second main electrode layer 221 is provided between the dielectric layer 23 and the second main electrode layer 221 which is the main electrode layer in the electrode layer that stores negative charges. Thus, according to the thin-film capacitor 20, it is possible to improve reliability including reliability with respect to high temperature load.

Hereinafter, a modification of the thin-film capacitor 20 according to the present embodiment will be described with reference to FIG. 4. In the thin-film capacitor 20 described in the aforementioned embodiment, the first electrode layer 21 is configured to include one electrode layer (the first main electrode layer). However, the first electrode layer 21 which stores positive charges may also include a plurality of electrode layers. In such a case, the first electrode layer 21 may be a combination of a main electrode layer and another electrode layer (a sub-electrode layer) as similar to the second electrode layer 22. However, in the first electrode layer 21, the main electrode layer is in contact with the dielectric layer 23. This point is different from the second electrode layer 22.

A thin-film capacitor 20A according to the modification illustrated in FIG. 4 differs from the thin-film capacitor 20 in the following points. That is, the first electrode layer 21 is formed by laminating a first main electrode layer 211 and a first sub-electrode layer 212. The first main electrode layer 211 is in contact with the dielectric layer 23. Furthermore, the first sub-electrode layer 212 is laminated on the lower side of the first main electrode layer 211 in the drawing, that is, in a direction apart from the dielectric layer 23. Accordingly, the first sub-electrode layer 212, the first main electrode layer 211, and the dielectric layer 23 are laminated in this order mentioned.

Even in the thin-film capacitor 20A, as similar to the thin-film capacitor 20, the first electrode layer 21 stores positive charges supplied through the through hole via 51, and the second electrode layer 22 stores negative charges supplied through the through hole via 52. As similar to the through hole vias 51 and 52 illustrated in FIG. 1, in a case where vias are formed to penetrate electrode layers and a dielectric layer, through hole vias 51 and 52 are configured to connect with each layer of the electrode layers which are electrically connected to the vias. However, in a case where vias are formed not to penetrate electrode layers, as similar to vias illustrated as the through hole vias 51 and 52 in FIG. 4, the vias are connected to the outermost metal layers of a thin-film capacitor. In other words, the first sub-electrode layer 212 is connected to the via in the first electrode layer 21, and the second main electrode layer 221 is connected to the via in the second electrode layer 22.

As similar to the thin-film capacitor 20, the thin-film capacitor 20A is also characterized by selection of metallic materials included in the electrode layers 21 and 22. Specifically, metallic materials included in the first main electrode layer 211 of the first electrode layer 21, the second main electrode layer 221 of the second electrode layer 22, the second sub-electrode layer 222 of the second electrode layer 22, and the first sub-electrode layer 212 of the first electrode layer 21 are selected so that each melting point satisfies a predetermined relationship. More specifically, each melting point satisfies the following relationships in Formulae (5) to (7), where T1 represents the melting point of the material of the first main electrode layer 211 of the first electrode layer 21, T2 represents the melting point of the material of the second main electrode layer 221 of the second electrode layer 22, T3 represents the melting point of the material of the second sub-electrode layer 222 of the second electrode layer 22, and T4 represents the melting point of the material of the first sub-electrode layer 212 of the first electrode layer 21.

$$T1 > T2 \tag{5}$$

$$T3 > T2 \tag{6}$$

$$T1 > T4 \tag{7}$$

In other words, the melting point T2 of the material of the second main electrode layer 221 of the second electrode layer 22 is lower than the melting point T1 of the material of the first main electrode layer 211 of the first electrode layer 21 and the melting point T3 of the material of the second sub-electrode layer 222 of the second electrode layer 22. Furthermore, the melting point 14 of the material of the first sub-electrode layer 212 of the first electrode layer 21 is lower than the melting point T1 of the material of the first main electrode layer 211. In the thin-film capacitor 20A, the first main electrode layer 211, the first sub-electrode layer 212, the second main electrode layer 221, and the second sub-electrode layer 222 are selected so as to satisfy the above relationships.

In regard to a combination of materials of the first main electrode layer 211, the first sub-electrode layer 212, the second main electrode layer 221, and the second sub-electrode layer 222 that satisfies the above relationships, Cu may be selected as the main components of the first sub-electrode layer 212 and the second main electrode layer 221 and Ni may be selected as the main components of the first main electrode layer 211 and the second sub-electrode layer 222. It should be noted that this combination is an example, and the materials of the aforementioned electrode layers are not limited to this combination.

In a case where the first electrode layer 21 includes two metal layers as in the thin-film capacitor 20A, a thickness of the first main electrode layer 211 is preferably set to about 0.05 μm to 20 μm so as to make it thicker than the first sub-electrode layer 212. However, a thickness of the first sub-electrode layer 212 may be substantially equivalent to that of the first main electrode layer 211. The thickness of the first main electrode layer 211 is preferably 0.05 µm to 20 µm. The first main electrode layer 211 having a thickness smaller than 0.05 µm leads to malfunction as the barrier metal layer with respect to the first sub-electrode layer 212. On the other hand, the first main electrode layer 211 having a thickness larger than 20 µm may lead to deterioration in a high frequency characteristic.

Figure 4:
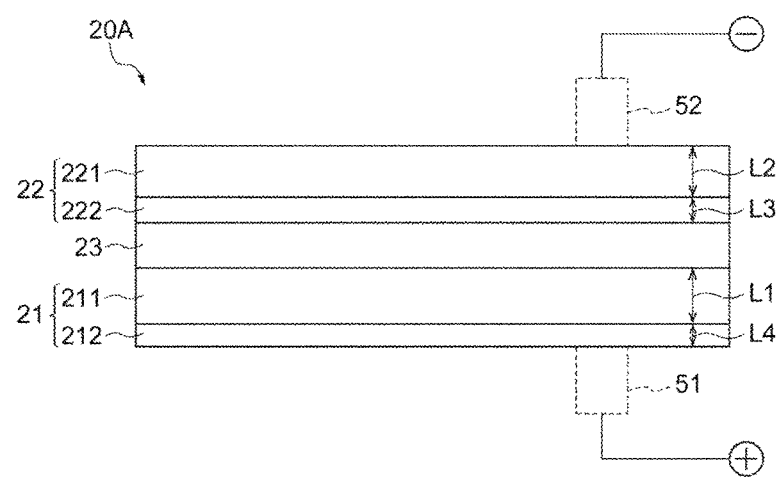
FIG. 4 is a schematic view of a thin-film capacitor according to a modification.

In other words, as illustrated in FIG. 4, it is preferable to satisfy the following Formulae (8) to (10), where L1 represents the thickness of the first main electrode layer 211 of the first electrode layer 21, L2 represents the thickness of the second main electrode layer 221 of the second electrode layer 22, L3 represents a thickness of the second sub-electrode layer 222 of the second electrode layer 22, and L4 represents a thickness of the first sub-electrode layer 212 of the first electrode layer 21.

$$L2 > L3 \quad (8)$$

$$L1 > L3 \quad (9)$$

$$L2 \geq L4 \quad (10)$$

Among the above Formulae, Formula (8) represents a relationship between the thickness of the second main electrode layer 221 and that of the second sub-electrode layer 222. Furthermore, Formula (9) represents a relationship between the thickness of the second sub-electrode layer 222 and that of the first main electrode layer 211.

As described above, as similar to the thin-film capacitor 20, the thin-film capacitor 20A according to the modification also satisfies the relationship of T1>T2, where T1 represents the melting point of the material of the first main electrode layer 211 of the first electrode layer 21 that stores positive charges, and T2 represents the melting point of the material of the second main electrode layer 221 of the second electrode layer 22 that stores negative charges. In such manners, in a case where two electrode layers including main electrode layers formed of materials having different melting points are used, and where an electrode layer including a main electrode layer formed of a material having a low melting point (the second electrode layer 22 in the thin-film capacitor 20) is configured to store negative charges (is biased to the negative side), it is possible to improve reliability of the thin-film capacitor 20A and to prolong lifetime as a capacitor.

In order to prevent contact between the dielectric layer 23 and the main electrode layer formed of the material having the low melting point (the second main electrode layer 221 in the thin-film capacitor 20), the second sub-electrode layer 222 formed of the material having the melting point higher than that of the material included in the second main electrode layer 221 is provided between the second main electrode layer 221 and the dielectric layer 23. Accordingly, it is also possible to improve reliability with respect to high temperature load in the thin-film capacitor 20A. Thus, as similar to the thin-film capacitor 20, it is possible to improve reliability including reliability with respect to high temperature load in the thin-film capacitor 20A.

Furthermore, in the thin-film capacitor 20A, Cu may be selected as the main components of the second main electrode layer 221 and the first sub-electrode layer 212 as in the aforementioned exemplary combination. In other words, in the thin-film capacitor 20A, regarding two electrode layers sandwiching the dielectric layer 23, Cu may be employed as the main component of the material of each outermost metal layer (layers located at both ends when the thin-film capacitor 20A is viewed along the lamination direction). With such a structure, it is possible to preferably maintain connection with vias physically connected to electrode layers, which further enhances reliability as a capacitor. Although any material may be appropriately selected as a material of a via, it is often the case that Cu is selected as a main component. Therefore, using Cu as the main component of the material of each outermost metal layer in the thin-film capacitor 20A leads to enhancement of adhesion with the vias, which preferably maintains the connection between the vias and the thin-film capacitor 20A. When the through hole vias 51 and 52 are used as in the electronic component embedded substrate 2, electrode layers other than the outermost layers are also connected to the vias. However, the outermost layers may be connected to vias depending on a method for connecting with the vias. In such a case, when Cu is selected as the main component of the material of each outermost layer, effects of adhesion to the vias markedly improves as compared to a case of selecting other materials. Even in a case where the main component of the material of one outermost metal layer is Cu, it is possible to preferably maintain the connection with the vias in the electrode layer on the same side.

In a case where the first electrode layer 21 or the second electrode layer 22 includes a plurality of electrode layers, two adjacent electrode layers may include therebetween an alloy layer formed of metallic materials included in the two electrode layers. For example, in a case where Ni is employed as a main component of the first main electrode layer 211 and Cu is employed as a main component of the first sub-electrode layer 212, an Ni—Cu alloy layer may be formed between the first main electrode layer 211 and the first sub-electrode layer 212. In such a manner, forming an alloy layer made of materials included in two electrode layers between two adjacent electrode layers leads to improvement in adhesion between the two electrode layers, which improves reliability as a thin-film capacitor. In particular, when one of the two electrode layers is Cu, the alloy layer prevents Cu having low self-diffusion activation energy (a low melting point) from diffusing to other layers. In such a manner, as the alloy layer is formed between a metal layer having low self-diffusion activation energy (a low melting point) and a metal layer adjacent to the metal layer, it is possible to further enhance reliability as a thin-film capacitor. It should be noted that an alloy layer can be formed by controlling sputtering temperatures of a Cu layer at the time of manufacturing a thin-film capacitor, or by controlling conditions in heat treatment after forming a laminated body, and a known method may be used.

An embodiment of the present invention has been described. However, the present invention is not necessarily restricted to the aforementioned embodiment and can be modified within the range of the gist of the present invention.

For example, the structure of the electronic component embedded substrate 2 described in the above embodiment is not limited to the above embodiment and can be changed appropriately. For example, the first electrode layer 21 and the second electrode layer 22 may be electrically connected to other wiring layers and the like through vias having shapes different from those of the through hole vias 51 and 52.

In the above embodiment, described is a case where the first electrode layer 21 includes one layer or two, and the second electrode layer 22 includes two layers; however, each electrode layer may include three or more layers. Even in this case, a first main electrode layer of a first electrode layer is in contact with a dielectric layer, and at least one electrode layer (a second sub-electrode layer) is provided between a second main electrode layer and the dielectric layer in a second electrode layer. As long as main components of materials of these electrode layers satisfy the relationship described in the aforementioned embodiment, the effects described in the aforementioned embodiment are exerted.

What is claimed is:

1. A thin-film capacitor, comprising:
   a pair of electrode layers composed of a first electrode layer configured to store a positive charge and a second electrode layer configured to store a negative charge; and
   a dielectric layer sandwiched between the pair of electrode layers along a lamination direction, wherein:
   the first electrode layer includes a first main electrode layer which is in contact with the dielectric layer,
   the second electrode layer includes a second main electrode layer and a second subelectrode layer, both of which are formed of different metallic materials,
   the second sub-electrode layer is sandwiched between the dielectric layer and the second main electrode layer along the lamination direction,
   the second main electrode layer has a melting point lower than both a melting point of the first main electrode layer and a melting point of the second sub-electrode layer, and
   the second main electrode layer is thicker than the second sub-electrode layer in the lamination direction; wherein the first electrode layer includes a first sub-electrode layer formed of a metallic material different from the material of the first main electrode layer,
   wherein the first sub-electrode layer is disposed on a side opposite to the dielectric layer along the lamination direction, being in contact with the first main electrode layer, and the melting point of the first main electrode layer is higher than a melting point of the first sub-electrode layer; the first main electrode layer is thicker than the first sub-electrode layer in the lamination direction; the first main electrode layer is thicker than the second sub-electrode layer in the lamination direction; and the second main electrode layer is equal in thickness to or thicker than the first subelectrode layer in the lamination direction.

2. The thin-film capacitor according to claim 1, wherein the thin-film capacitor has layers at both ends, when viewed along the lamination direction, both of which are formed of a material including copper as a main component.

3. The thin-film capacitor according to claim 2, wherein at least one layer of each layer at both ends in the thin-film capacitor, when viewed along the lamination direction, has an alloy layer between a layer laminated on the inner side of each layer at both ends,
   wherein the alloy layer includes copper and a main component of the layer laminated on the inner side.

4. The thin-film capacitor according to claim 1, wherein the first main electrode layer and the second sub-electrode layer are formed of a material including as a main component any one of tantalum, nickel, tungsten, platinum, palladium, iridium, ruthenium, and rhodium, or an alloy of these metals.

5. The thin-film capacitor according to claim 1, wherein the second sub-electrode layer has a thickness of 0.05 µm to 10 µm.

6. An electronic component embedded substrate, comprising:
   the thin-film capacitor according to claim 1; and
   a pair of vias electrically connected to the first electrode layer and the second electrode layer of the thin-film capacitor.

7. The thin-film capacitor according to claim 1, wherein the first electrode layer is thicker than the second sub-electrode layer in the lamination direction.

8. The thin-film capacitor according to claim 5, wherein the second main electrode layer has a thickness of 1 µm to 40 µm.

9. The thin-film capacitor according to claim 1, wherein the first electrode layer is formed of a metallic foil.

* * * * *